United States Patent [19]

McComas

[11] 4,271,455

[45] Jun. 2, 1981

[54] INDICATOR AND CONTROL DEVICE FOR PC BOARDS

[75] Inventor: Ralph J. McComas, Boulder Creek, Calif.

[73] Assignee: Perception Electronics, Inc., San Jose, Calif.

[21] Appl. No.: 77,924

[22] Filed: Sep. 24, 1979

[51] Int. Cl.³ .............................................. H05K 7/06
[52] U.S. Cl. .................................. 361/331; 361/419; 361/426; 340/381
[58] Field of Search .................. 340/366 E, 381, 762; 361/331, 346, 347, 380, 412, 417, 419, 420, 426, 399, 415

[56] References Cited

U.S. PATENT DOCUMENTS

| | | | |
|---|---|---|---|
| 3,766,550 | 10/1973 | Vandemore | 340/381 |
| 4,092,698 | 5/1978 | Brefka | 361/346 |
| 4,163,274 | 7/1979 | Carolus | 361/417 |

Primary Examiner—Gerald P. Tolin
Attorney, Agent, or Firm—Claude A. S. Hamrick

[57] ABSTRACT

An indicator and control device for PC boards is shown to include a component-mounting plate and a pair of insulating standoff members. The mounting plate is a thin, rectangular plate of aluminum having a number of holes or apertures formed through it and through which switches, lights, and indicators are disposed.

12 Claims, 4 Drawing Figures

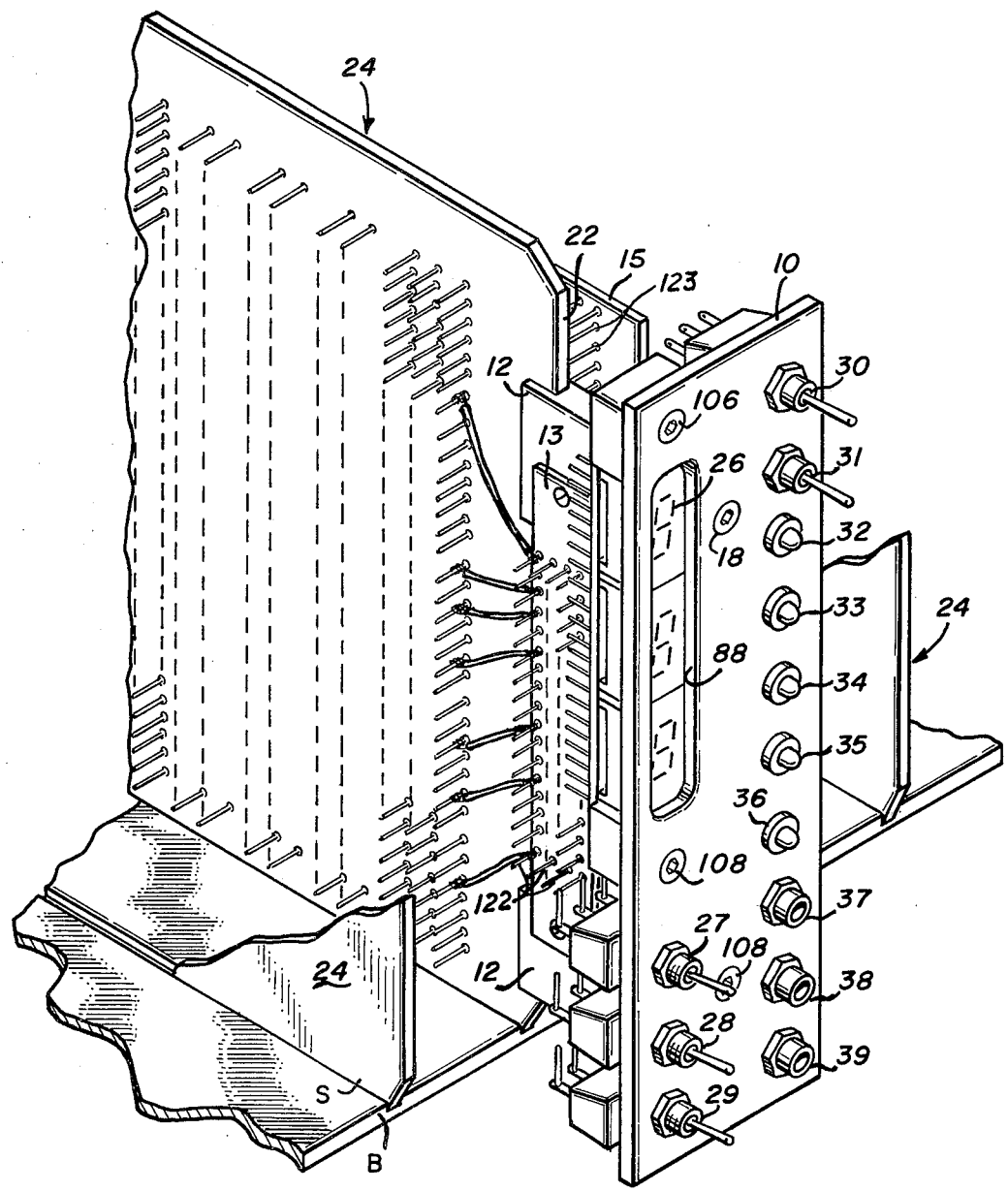
Fig_1

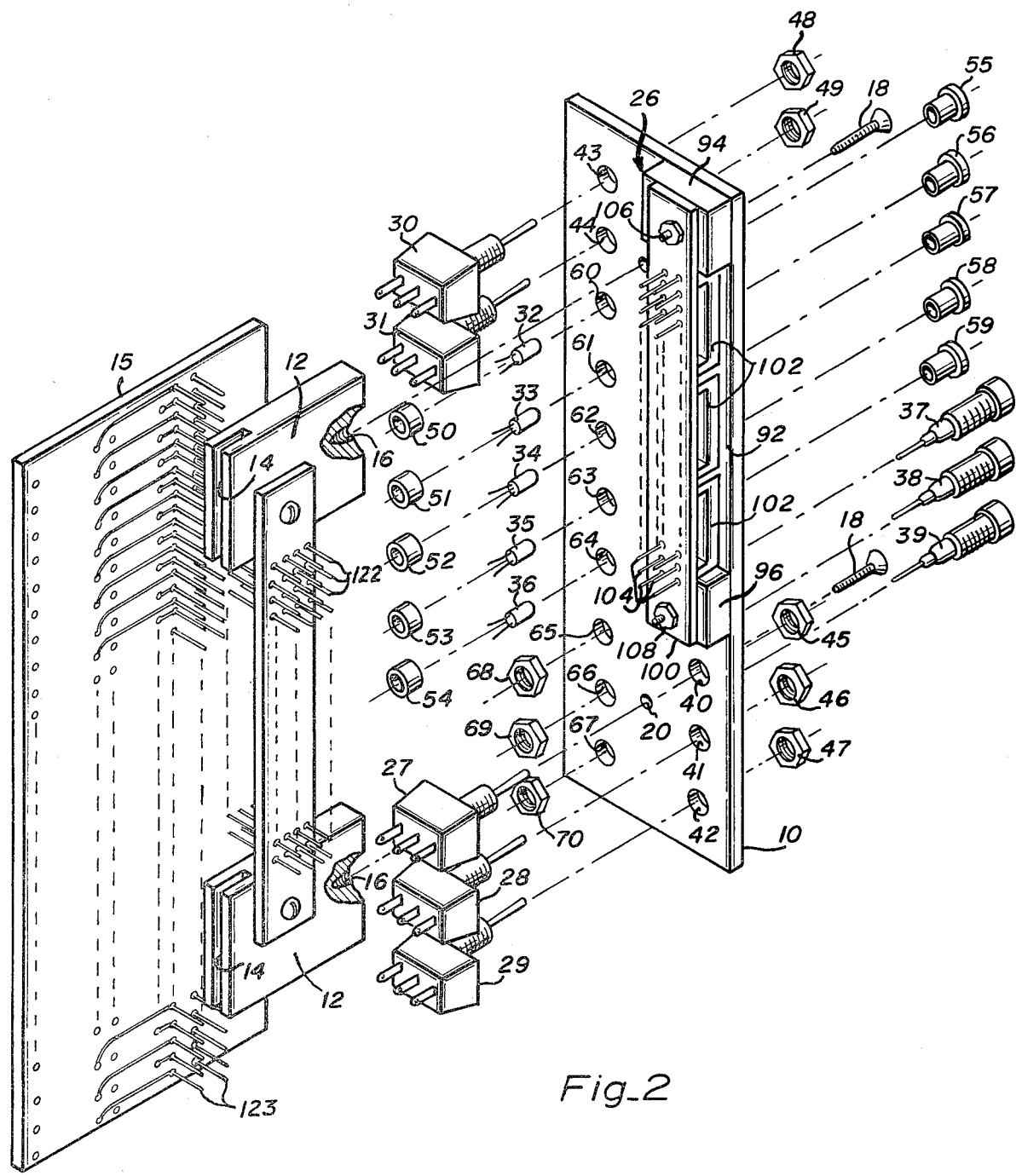
Fig_2

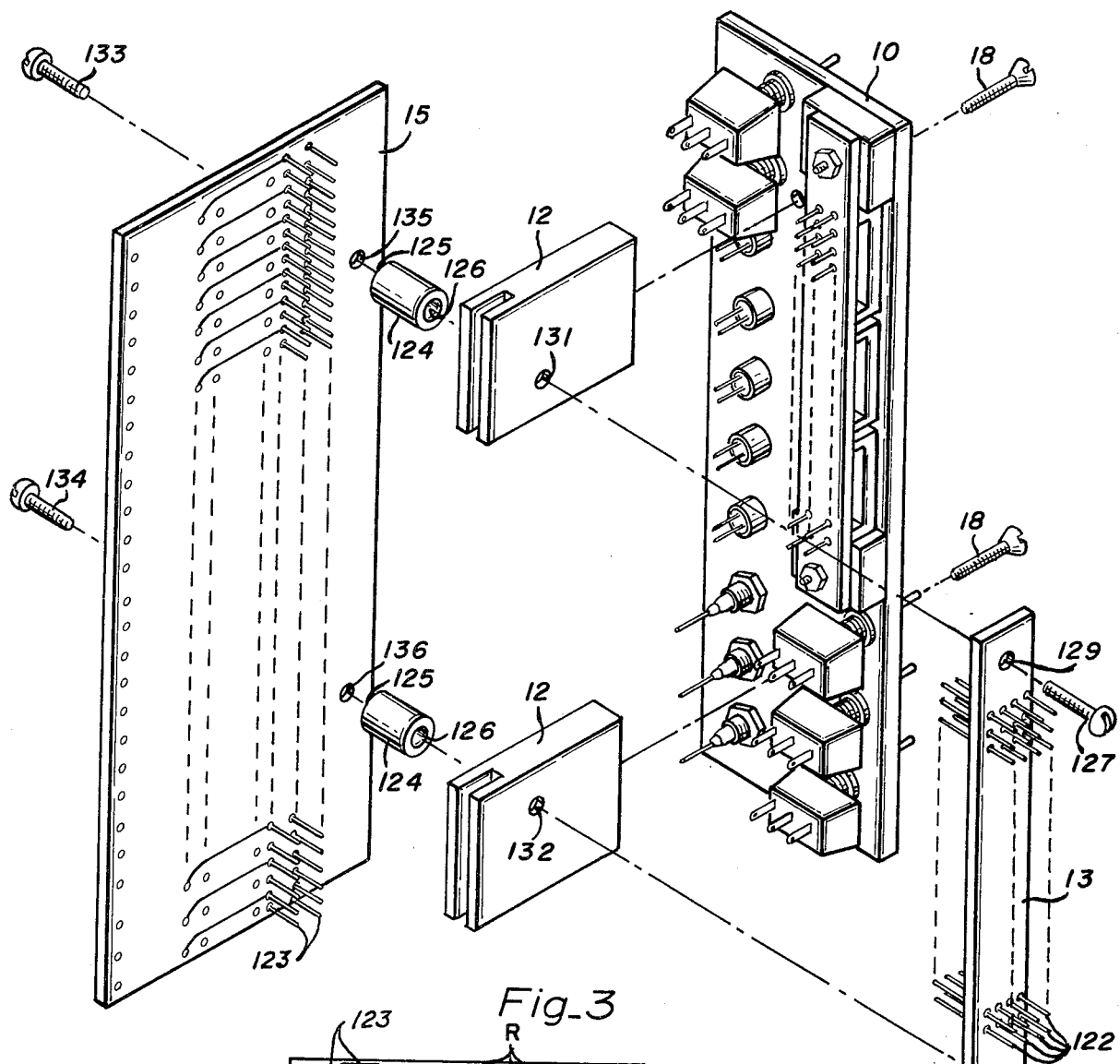
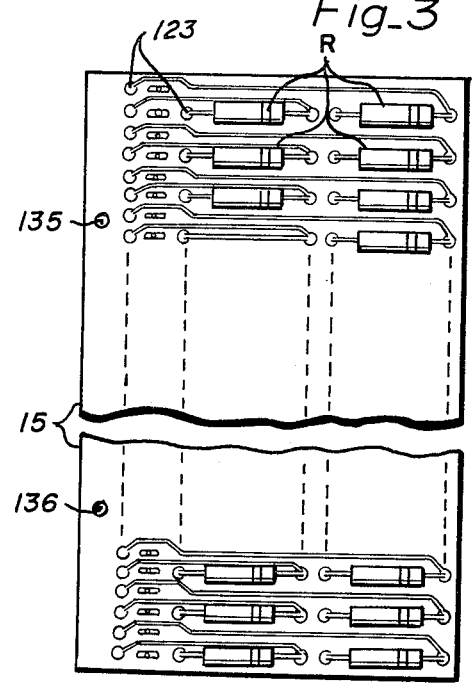
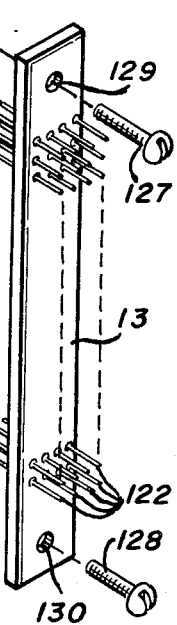
Fig_3
Fig_4

INDICATOR AND CONTROL DEVICE FOR PC BOARDS

BACKGROUND OF THE INVENTION

1. Field of the Invention

The present invention relates generally to electronic indicator and control devices and more particularly to an improved indicator and control device which can be attached to a printed circuit card in situ externally connected thereto and then used to control and indicate certain operations of the board without requiring that it be disconnected from the motherboard.

2. Description of the Prior Art

Complex electronic devices typically are comprised of subcircuit modules constructed as plug-in circuit board "cards" which are easily removable for replacement and repair. The problem is that in most such electronic apparatus, the cards are arranged in closely packed space-saving rows which make it difficult to obtain access to the cards for testing without removing the card from the motherboard.

One way to enable the operation of a board to be inspected without removing it from the containing apparatus is to mount an indicator and control device to an external edge of the board such as is disclosed in the co-pending U.S. patent appplication of Ralph J. McComas, Ser. No. 894,714, Filed, Apr. 10, 1978, the subject matter of which is hereby corporated by reference into this application. However, in practice it has been found that electrical interconnect between the indicator and control device and the circuit card frequently requires the addition of level setting and biasing resistors and other elements which cannot be conveniently added to either the circuit card or the indicator and control device.

SUMMARY OF THE PRESENT INVENTION

It is therefore a principle objective of the present invention to provide an improved indicator and control device which includes all the level setting and biasing components required to facilitate electrical interconnection to a particular PC board.

Another object of the present invention is to provide a device of the type described which in addition includes a terminal strip for facilitating connection of the indicator and control device directly to the PC board components.

Briefly, a presently preferred embodiment of the present invention includes an elongated generally rectangular component mounting plate, electrical switch and indicator means attached to the mounting plate, a pair of insulating standoff members affixed to the rear surface of the mounting plate and spaced apart relationship for attaching the device to an edge of a PC board, a PC subcard carrying biasing elements and affixed in standoff relationship to said standoff members and a terminal strip affixed to the opposite sides of said standoff members, said terminal strip serving to facilitate interconnection of said indicator and control components and said biasing components to the PC board.

One advantage of the present invention is that it makes it possible for a single indicator and control device to be utilized to monitor and control a wide variety of PC cards.

Another advantage of the present invention is that the device may be prewired so that once mounted on a PC board, all connections between the device and the PC board may be made to a single easily accessible terminal strip.

These and other objects and advantages of the present invention will no doubt become apparent to those of ordinary skill in the art after having read the following detailed description of the preferred embodiment which is shown in the several figures of the drawing.

IN THE DRAWING

FIG. 1 is a perspective view showing the subject indicator and control device connected to a printed circuit board;

FIG. 2 is a partially exploded rear view of the indicator and control device showing certain components thereof;

FIG. 3 is a partially exploded rear view of the indicator and control device showing certain other components thereof; and FIG. 4 is an elevational view showing the opposite side of the biasing/terminal board shown in FIGS. 2 and 3.

DESCRIPTION OF THE PREFERRED EMBODIMENTS

Referring to FIGS. 1 and 2 of the drawing, an indicator and control device for PC boards and the like is shown to include a component-mounting plate 10 and a pair of insulating standoff members 12. Mounting plate 10 is a thin, rectangular plate of aluminum having a number of holes or apertures formed through it through which switches, lights, and indicators can be disposed as shown.

Standoff members 12 are rectangular blocks of an insulating material such as phenolic. Formed on one side of each standoff member 12 is a slot 14 and formed in the opposing side is a threaded bolt hole 16. In this preferred embodiment, bolts 18 are disposed through holes 20 in the mounting plate to engage the bolt holes 16 and to firmly hold the standoff members against the back surface of the component-mounting plate. Attached to the standoffs 12 are terminal contact boards 13 and 15 which will be described below.

As shown in FIG. 1, the indicator and control device is attached to an edge 22 of one of a plurality of printed circuit cards 24 that are supported within slots 5 in a base B and are plugged into a motherboard (not shown). Slots 14 of the standoff members slip over edge 22 of the card. The slots are designed to be only slightly wider than the width of the card so that a slight amount of frictional engagement occurs. The standoff members can be glued to the board by means of a suitable adhesive, such as epoxy.

The various components shown on mounting plate 10 include a seven-segment assembly 26, five SPDT switches 27, 28, 29, 30, and 31, five LED indicator lights 32, 33, 34, 35, and 36, and three female test jacks 37, 38, and 39.

As shown in FIG. 2, switches 27, 28, 29, 30, and 31 are mounted from the rear surface of the mounting plate by disposing their threaded shafts through holes 40, 41, 42, 43, and 44, respectively, and are retained in position by nuts 45, 46, 47, 48, and 49, respectively.

LED indicating lights 32, 33, 34, 35, and 36 are attached to mounting plate 10 by means of mounting members 50, 51, 52, 53, 54, and 55, 56, 57, 58, and 59, respectively. Each LED mounting members (55, 56, 57, 58, and 59) has a flanged front portion and a split tubular portion extending rearwardly therefrom. The tubular portion of members 55, 56, 57, 58, and 59 are disposed through holes 60, 61, 62, 63, and 64, respectively, from the front of mounting plate 10. For example, LED 32 is inserted into the back of member 55 and a closing ring 50 locks the tubular portion of member 55 around the LED. At the same time ring 50 and the button-like shoulder of member 55 cooperate to hold the assembly in place within opening 43. The same locking arrangement applies for LED's 33, 34, 35, and 36 and their respective mounting members.

The three female test jacks 37, 38, and 39 are mounted from the front side of the mounting plate by disposing their shafts through holes 65, 66, and 67, respectively, and are retained in position by respective nuts 68, 69, and 70.

The seven-segment assembly 26 is mounted behind an aperture 88 in plate 10 and includes a viewing plate 92 which is secured against the back surface of the mounting plate 10 by a pair of mounting blocks 94 and 96. The viewing plate fully covers the aperture 88 and is usually tinted to accentuate the display.

Disposed against the rear surface of blocks 94 and 96 is a narrow printed circuit (PC) board 100 which supports three seven-segment devices 102 which are held in alignment with view plate 92 and aperture 88. Leads of the seven-segment devices extend through the printed circuit board to contact traces formed thereupon. The leads are soldered to the traces and are thereby electrically connected to wire wrap terminal pins 104.

The entire seven-segment assembly is held together by a pair of bolts 106 and 108 which extend through corresponding apertures in the mounting plate, mounting blocks and PC board 100. Suitable washers, lock washers and nuts are disposed over the ends of the respective bolts and tightened thereupon to rigidly bolt the seven-segment assembly both together and to plate 10.

Attached to the standoffs 12 are terminal boards 13 and 15, the former being strictly a holder of interconnect pins and the latter being a small printed circuit board carrying a plurality of biasing or other functional circuit elements. The construction of these boards can best be seen in FIGS. 3 and 4 which is an exploded rear perspective view of the arrangement.

Terminal board 13 contains three rows of terminal pins 122 which pass through and extend outwardly on both sides of the board. The three rows of pins are aligned vertically along the board. The board 15 contains two rows of terminal pins 123 which pass through and extend outwardly on only one side of the board. On the opposite side, a plurality of resistors R are connected to various ones of the pins 123 by means of printed circuit traces. In this embodiment, the circuit traces are formed along both sides of board 15 in order to connect the resistive elements to the terminal pins in a predetermined manner.

The standoff members 124 are tubular in shape and made of an insulating material such as a phenolic resin. Formed on both sides of each standoff member 124 are holes 125 and 126. In this embodiment, screws 127 and 128 are disposed through holes 129 and 130, respectively, in terminal board 13; and, holes 131 and 132 in standoff members 12 to threadably engage the holes 126 in the tubular standoff 124 and firmly secure them against one side of standoff member 12. In this way, the ends of terminal board 13 are securely mounted to the sides of standoff members 12.

Likewise, bolts 133 and 134 are disposed through holes 135 and 136, respectively, in PC board 15 to threadably engage the holes 125 and thereby secure the board 15 to the other ends of the tubular standoff members 124. Board 15 is thereby separated from standoff member 12 by the length of the tubular standoff members 124 and as previously described, the entire arrangement is attached to the back surface of the component mounting plate 10.

In this embodiment all indicator and control component leads are wired either directly to the pins 122 on one side of terminal board 13, or thereto via one of the circuits of board 15. This means that in connecting the electrical device to a PC card all connection between the board and the device can be made directly to the other ends of pins 122. This reduces installation time, provides more orderly manner of corrections, and reduces the liklihood of error.

Although the invention has been described in the terms of a preferred embodiment, it is contemplated that various alterations and modifications will become apparent to those skilled in the art after having read the preceding detailed description. For example, the mounting plates described could be formed of an inexpensive molded plastic instead of aluminum. Moreover, the apertures formed in the mounting plate can assume an almost infinite variety of patterns and shapes. Likewise, the resistive or other components may be arranged differently and be of an almost infinite variety of values chosen to suit a particular set of applications. It is therefore intended that the appended claims be interpreted to include all such alterations and modifications as fall within the true spirit and scope of my invention.

What is claimed is:

1. An indicator and control device for PC boards and the like comprising:
    an elongated generally rectangular component mounting plate having a front surface, a rear surface and a longitudinal axis, said plate being provided with at least one elongated aperture lying parallel to and laterally offset from said longitudinal axis, and at least one other aperture;
    an elongated indicator means affixed to said rear surface so as to be viewable through said elongated aperture;
    a manually operable electrical component mounted within said other aperture;
    a pair of insulating standoff members disposed along said longitudinal axis and provided with slots for receiving an edge of a circuit board;
    means attaching said standoff members to the rear surface of said mounting plate,
    a first terminal board attached to one side of said standoff members and having biasing elements mounted thereon;
    a second terminal board attached to the opposite side of said standoff members; and
    means for electrically interconnecting said indicator means, said electrical component, the biasing elements of said first terminal board and said second board, whereby said indicator and control device may be attached to a PC board by lodging an edge thereof within the slots of said standoff members, and may be electrically connected thereto by wiring said second terminal board to the electrical circuits of said PC board.

2. An indicator and control device as recited in claim 1 wherein said second terminal board includes a plurality of contact pins extending therethrough and wherein the ends of said pins on one side are selectively connected to said indicator means, said electrical component and said biasing elements.

3. An indicator and control device as recited in claim 1 wherein said first terminal board has a plurality of terminal pins formed on one side and printed electrical circuits formed thereon for electrically connecting said biasing elements to said pins.

4. An indicator and control device as recited in claim 1 further comprising:
an elongated, transparent view plate disposed against the rear surface of said mounting plate and covering said elongated aperture;
a first mounting block disposed to engage a first end portion of said view plate;
first means for attaching said first mounting block to the rear surface of said mounting plate;
a second mounting block disposed to engage a second end portion of said view plate, and
second means for attaching said second mounting block to the rear surface of said mounting plate, whereby said first and said second mounting blocks retain said view plate in position against the rear surface of said mounting plate and over said aperture.

5. An indicator and control device as recited in claim 4 wherein said first and said second mounting blocks are each provided with a slot receptive to respective end portions of said viewing plate.

6. An indicator and control device as recited in claim 1 wherein said standoff members are shaped like rectangular prisms and have opposing front and rear surfaces, whereby said front surfaces of said standoff members abut said rear surface of said mounting plate and said slots are formed inwardly from said rear surface of said standoff member.

7. An indicator and control device for mounting to an edge of PC boards and the like comprising:
an elongated generally rectangular component mounting plate having a front surface, a rear surface and a longitudinal axis, said plate being provided with an indicator aperture and another aperture;
an indicator means affixed to said mounting plate at said indicator aperture;
a manually operable electrical component mounted within said other aperture;
a pair of insulating standoff members disposed along said longitudinal axis and provided with slots for receiving an edge of the PC board to which said device is to be mounted;
means attaching said standoff members to the rear surface of said mounting plate;
a first terminal board attached to one side of said standoff members and having biasing elements mounted thereon;
a second terminal board attached to the opposite side of said standoff members and having means forming electrical terminals; and
means for electrically interconnecting said indicator means, said electrical component, the biasing elements of said first terminal board, and the terminals of said second board, whereby said indicator and control device may be attached to a PC board by lodging an edge thereof within the slots of said standoff members, and may be electrically connected thereto by wiring the terminals of said second terminal board to the electrical circuits of said PC board.

8. An indicator and control device as recited in claim 7 wherein said second terminal board includes a plurality of contact pins extending therethrough to form said terminals and wherein the ends of selected ones of said pins on one side are respectively connected to said indicator means, said electrical component and said biasing elements.

9. An indicator and control device as recited in claim 7 wherein said first terminal board has a plurality of terminal pins formed on one side and printed electrical circuits formed thereon for electrically connecting said biasing elements to said pins.

10. An indicator and control device as recited in claim 7 wherein said indicator aperture is elongated and lies parallel to and laterally offset relative to said longitudinal axis, and said device further comprises:
an elongated, transparent view plate disposed against the rear surface of said mounting plate and covering said indicator aperture;
a first mounting block disposed to engage a first end portion of said view plate;
first means for attaching said first mounting block to the rear surface of said mounting plate;
a second mounting block disposed to engage a second end portion of said view plate; and
second means for attaching said second mounting block to the rear surface of said mounting plate, whereby said first and said second mounting blocks retain said view plate in position against the rear surface of said mounting plate and over said indicator aperture.

11. An indicator and control device as recited in claim 10 wherein said first and said second mounting blocks are each provided with a slot receptive to respective end portions of said viewing plate.

12. An indicator and control device as recited in claim 7 wherein said standoff members are shaped like rectangular prisms and have opposing front and rear surfaces and wherein said front surfaces of said standoff members abut said rear surface of said mounting plate and said slots are formed inwardly from said rear surface of said standoff member.

* * * * *